United States Patent
Potter et al.

(10) Patent No.: US 8,657,991 B2
(45) Date of Patent: Feb. 25, 2014

(54) ROBOTIC SOLAR PANEL STRING ASSEMBLY PROCESS

(75) Inventors: David S. Potter, Danville, CA (US); Nathan Dion Fleischer, Berkeley, CA (US); Jeffrey Paul Munoz, Oakley, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 157 days.

(21) Appl. No.: 13/368,621

(22) Filed: Feb. 8, 2012

(65) Prior Publication Data
US 2012/0199266 A1 Aug. 9, 2012

Related U.S. Application Data

(60) Provisional application No. 61/440,766, filed on Feb. 8, 2011.

(51) Int. Cl.
*B29C 65/54* (2006.01)
*H01L 31/048* (2006.01)
*B32B 38/18* (2006.01)

(52) U.S. Cl.
USPC ........... 156/297; 156/299; 156/356; 156/362; 156/560; 901/27; 901/40; 901/43; 136/251

(58) Field of Classification Search
USPC ......... 156/297, 299, 356, 362, 556, 559, 560; 901/27, 40, 43; 136/251
See application file for complete search history.

(56) References Cited

U.S. PATENT DOCUMENTS

| 4,909,869 A * | 3/1990 | Sakamoto et al. | 156/64 |
| 4,966,631 A * | 10/1990 | Matlin et al. | 136/244 |
| 2009/0205703 A1* | 8/2009 | Umotoy et al. | 136/251 |
| 2012/0027550 A1* | 2/2012 | Bellacicco et al. | 414/547 |

* cited by examiner

*Primary Examiner* — Michael Tolin
(74) *Attorney, Agent, or Firm* — Carlos L. Hanze

(57) ABSTRACT

The present invention is directed to a process for manufacture of a solar panel string assembly for a solar canopy including: horizontally aligning two solar panel support channels substantially parallel to one another; applying an adhesive with a robotic tool to an upper portion of the solar panel support channels, the robotic tool comprising a fixed track aligned parallel with the two solar panel support channels, a robotic arm assembly movably supported by the track, a positioning member for adjusting the position of the robotic arm assembly along the track, and wherein the robotic arm comprises an adhesive applicator and a vacuum lift component; and lifting with the vacuum lift component of the robot arm assembly of the robotic tool and aligning a solar panel on top of the two solar panel support channels near opposing edges of the solar panel.

13 Claims, 3 Drawing Sheets

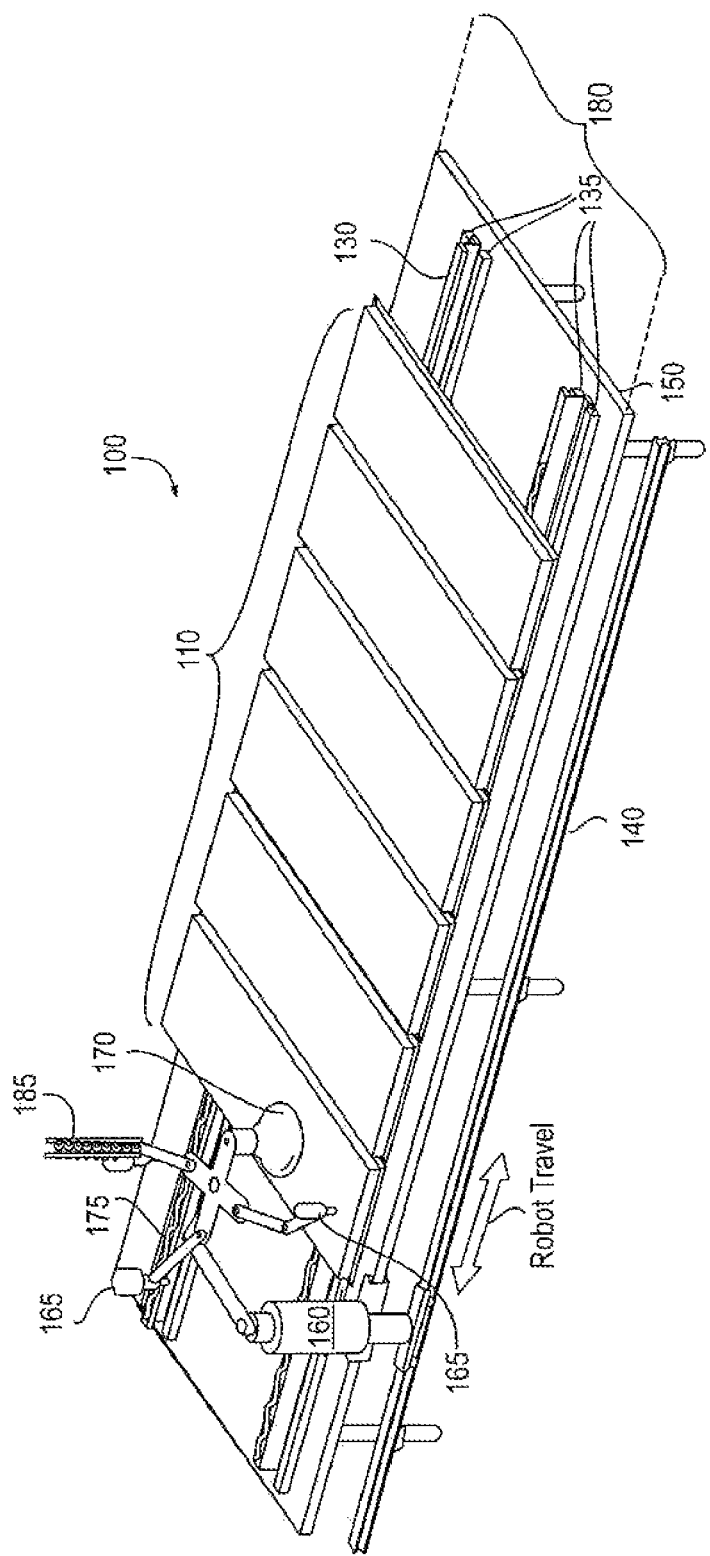

ROBOTIC SOLAR PANEL STRING ASSEMBLY PROCESS

COPYRIGHT NOTICE AND AUTHORIZATION

This patent document contains material which is subject to copyright protection. ©Copyright 2011-2012. Chevron Energy Solutions Company, a division of Chevron U.S.A. Inc. All rights reserved.

With respect to this material which is subject to copyright protection. The owner, Chevron Energy Solutions Company has no objection to the facsimile reproduction by anyone of the patent document or the patent disclosure, as it appears in the Patent and Trademark Office patent files or records of any country, but otherwise reserves all copyright rights whatsoever.

FIELD OF THE INVENTION

This invention relates an apparatus and method for pre-assembly of certain components of a solar canopy.

BACKGROUND OF THE INVENTION

Solar energy is a clean, renewal energy source. Photo-electro voltaic cell technology is increasing rapidly and makes installation of solar collector panels housing the photo-electro voltaic cells more and more economically feasible. Beyond the photo-electro voltaic cell technology itself are the problems of placement and support of the solar collector panels. Large numbers of solar collector panels must be assembled in series to achieve useful power production. In remote areas these may be placed on the ground without interfering with land use. In more developed areas, it is desirable to place the solar collector panels such that the land may also be used for other purposes, e.g., for parking lots, school/office hallways, playgrounds, or sports fields. To achieve this requires an elevated structure to support the solar collector panels.

In prior known systems, installation costs amount to around 25% of the overall cost of a solar parking shade installation. These installation cost includes the cost to place modules on a rack, wire the modules together and to a combiner box, bolt the modules in place, and place the support structure on a parking shade structure. These costs often amount to almost the actual panel cost themselves due to the lack of ability to achieve assembly efficiency as well as the need in governmental markets to use union labor.

An additional deficiency in known methods/systems for solar canopy installation is that the size of solar modules used is limited to the size module a contractor can physically carry. The installation process is also cumbersome and dangerous due to work on nonstandard sites and at an elevated height.

It is desirable to have a method and system which overcomes the deficiencies of known systems. The instant invention provides such a solution.

SUMMARY OF THE INVENTION

The invention in one embodiment includes a process for manufacture of a solar panel string assembly for a solar canopy, the process including: horizontally aligning two solar panel support channels substantially parallel to one another; applying an adhesive with a robotic tool to an upper portion of the solar panel support channels, the robotic tool comprising a fixed track aligned parallel with the two solar panel support channels, a robotic arm assembly movably supported by the track, a positioning member for adjusting the position of the robotic arm assembly along the track, and wherein the robotic arm comprises an adhesive applicator and a vacuum lift component; and lifting with the vacuum lift component of the robot arm assembly of the robotic tool and aligning a solar panel on top of the two solar panel support channels near opposing edges of the solar panel; and repeating the lifting step (c) until the desired number of solar panels are aligned side-by-side on the two solar panel support channels, thereby forming a solar panel string assembly.

The invention in another embodiment includes a system for manufacture of a solar panel string for a solar canopy, the system comprising: a platform for horizontally aligning two solar panel support channels substantially parallel to one another; a robot for applying an adhesive with a tool to an upper portion of the solar panel support channels, the robot comprising a fixed track aligned parallel with the two solar panel support channels, a robotic arm assembly movably supported by the track, a positioning member for adjusting the position of the robotic arm assembly along the track, and wherein the robotic arm comprises an adhesive applicator and a vacuum lift component; and a vacuum lift attached to the robot arm assembly for lifting and aligning a solar panel on top of the two solar panel support channels near opposing edges of the solar panel.

These and other features and advantages of the present invention will be made more apparent through a consideration of the following detailed description of a preferred embodiment of the invention. In the course of this description, frequent reference will be made to the attached drawings.

BRIEF DESCRIPTION OF THE DRAWINGS

FIG. 3 is an alternate perspective view of one embodiment of the present invention depicting lifting and aligning of solar panels on the support channels with a single robot arm having multiple integral tools.

DETAILED DESCRIPTION OF PREFERRED EMBODIMENTS

Other embodiments of the present invention and its individual components will become readily apparent to those skilled in the art from the foregoing detailed description. As will be realized, the invention is capable of other and different embodiments, and its several details are capable of modifications in various obvious respects, all without departing from the spirit and the scope of the present invention. Accordingly, the drawings and detailed description are to be regarded as illustrative in nature and not as restrictive. It is therefore not intended that the invention be limited except as indicated by the appended claims.

As used in this specification and claims, the "solar panel support channels" comprise "Z"-shaped sheet metal, i.e., "Zee-channels" or "Z-channels", "C"-shaped sheet metal, i.e., "Cee-channels" or "c-channels", or standard beams, bars, and other suitable support members.

Figures 1A, 1B:
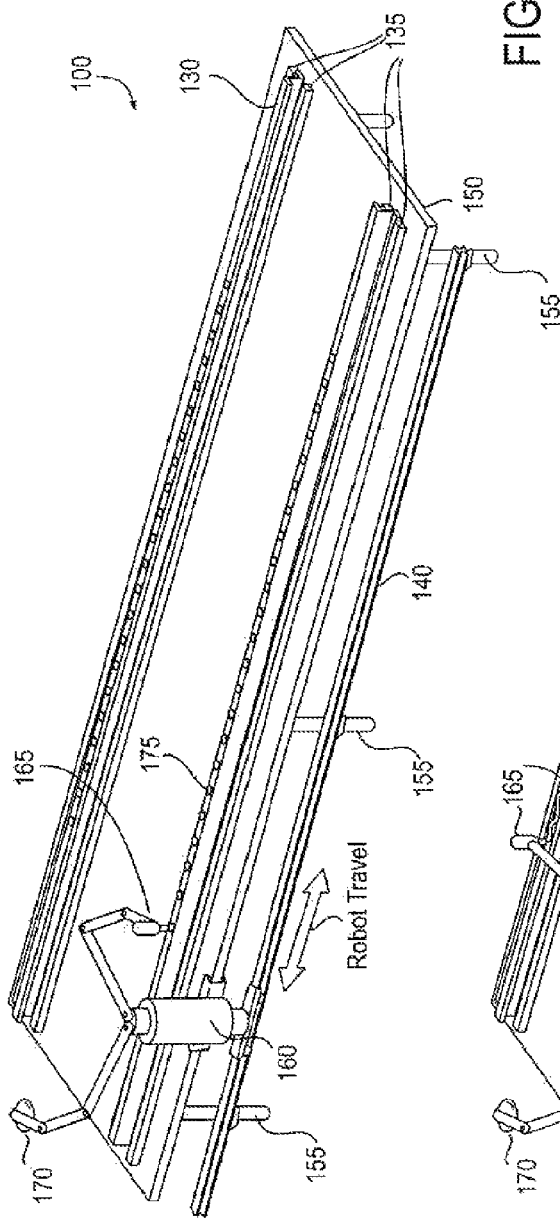
FIG. 1A is a perspective view of one embodiment of the present invention depicting applying glue on one support channel at a time.
FIG. 1B is a perspective view of one embodiment of the present invention depicting invention depicting applying glue on 2 support channels at a time.

With reference to FIG. 1A, solar panel string assembly system 100 has a length and width sufficient to support several solar panels at one time, e.g., 6-10 solar panels. Solar panel string assembly system 100 includes a substantially planar base component 150, preferable with legs 155 or other means for raising it up to a suitable working height as needed and for attaching fixed track 140. Also there are two sets of solar panel support channel guides 135 attached to the top of the planar base component 150. Two solar panel support channels 130 are positioned in the solar panel support channel guides 135. The positioning is done manually, robotically, or any other known means. The next step is positioning of the solar panels.

Robot 160 attaches the solar panels to the two solar panel support channels 130. Robot 160 is movably attached via any known means including via a movable slide at the lower portion of the robot movably connected to fixed track 140, with optional rail track attached at the "belly" of the robot 160 and the rail track movably attached or interfaced with one straight edge portion of planar base component 150. This permits the robot 160 to move up and down the full length of the solar panel string assembly system 100. One or more arms movably attached at an upper portion of the robot 160 optionally have one or more tools useful for moving solar panels and/or attaching solar panels to the two solar panel support channels 130.

Attachment may be by any known means, including gluing, riveting, screwing, bolting, or welding. Where gluing is used a glue gun 165 is affixed or integral with one end of one articulating arm. Glue gun 165 is for applying glue 175 along the top of the length of the two solar panel support channels 130. The robot has integral are attached variable and programmable process control means to program its movement along the length of the rail track 140 and for placement of the glue 175 using the glue gun 165. Optionally, another articulating arm 170 has powered suction cup 170 for lifting and moving solar panels.

In FIG. 1A, the glue 175 is applied in drops. As shown in FIG. 1B, glue 175 may also be applied in a ribbon or any other known pattern sufficient to provide a strong and durable gluing of the solar panels to the two solar panel support channels 130. Application methods, curing times, and other variables of gluing will vary with the specifications of the glue or other adhesive used. As shown in FIG. 1B, more than one articulating arm may have a glue gun 165 to allow, e.g., simultaneous application of glue to each solar panel support channel 130.

Figure 2:
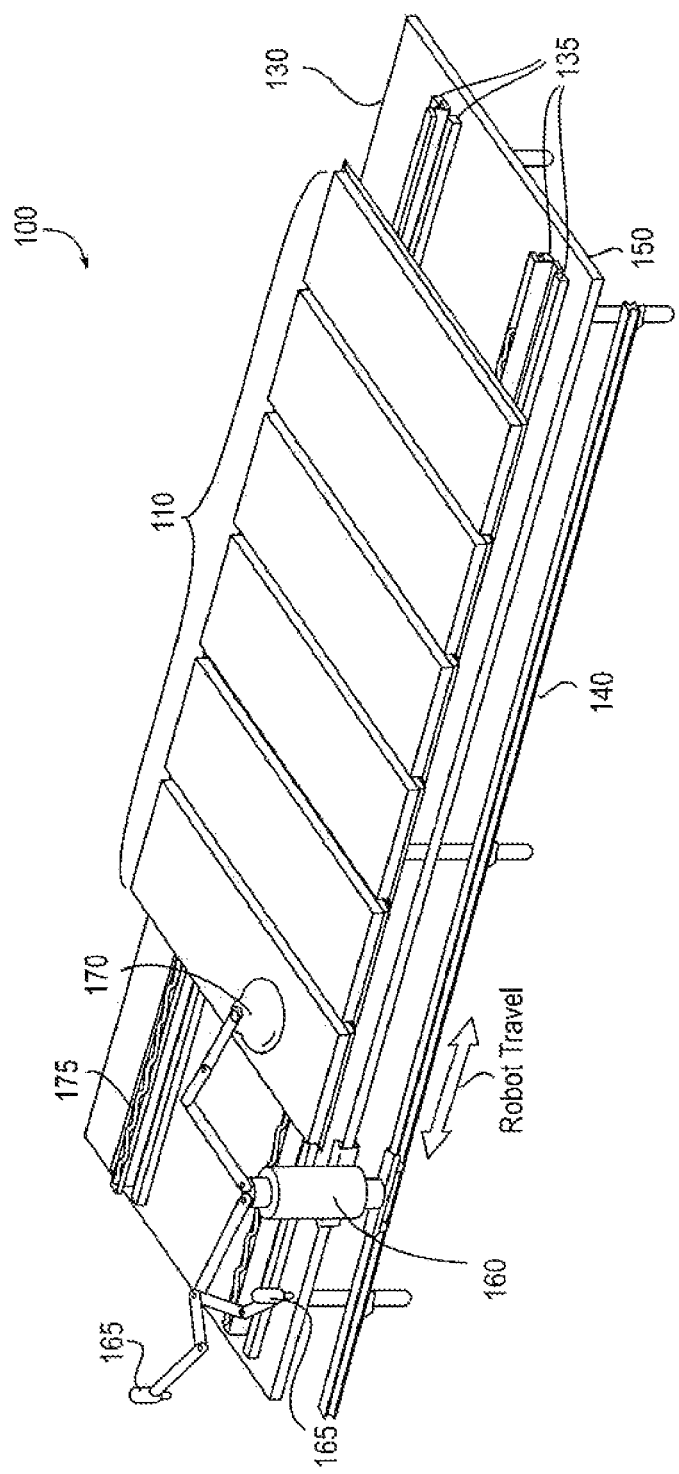
FIG. 2 is a perspective view of one embodiment of the present invention depicting lifting and aligning of solar panels on the support channels.

With reference to FIG. 2, the solar panels 110 may be loaded side-by-side on top of the two solar panel support channels 130 manually or via the powered suction cup 170 of the robot 160, or via any other known means.

With reference to FIG. 3 in this embodiment the robot arm has multiple integral or attached tools. In addition to powered suction cup 170 and glue gun 165 is rivet gun 185. Other optional tools include any known tools to aid in attachment of solar panels 110 to support channels 130, e.g., a welding tool. Once all solar panels 110 are attached to support channels 130 and any other assembly work is done, e.g., electrically connecting the solar panels 110 or attaching electrical inverter or control components, then completed solar array assembly 180 is ready to transport or install.

What has been described above includes example embodiments of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as that term is interpreted as a transitional word in a claim.

What is claimed is:

1. A process for manufacture of a solar panel string assembly for a solar canopy, the process comprising:
    (a) horizontally aligning two solar panel support channels substantially parallel to one another;
    (b) applying an adhesive with a robotic tool to an upper portion of the solar panel support channels, the robotic tool comprising a fixed track aligned parallel with the two solar panel support channels, a robotic arm assembly movably supported by the track, a positioning member for adjusting the position of the robotic arm assembly along the track, and wherein the robotic arm comprises an adhesive applicator and a lift component; and
    (c) lifting with the lift component of the robot arm assembly of the robotic tool and aligning a solar panel on top of the two solar panel support channels near opposing edges of the solar panel; and
    (d) repeating the lifting step (c) until the desired number of solar panels are aligned side-by-side on the two solar panel support channels, thereby forming a solar panel string assembly.

2. The process of claim 1, wherein the solar panel string assembly lay parallel with the ground surface for loading on a truck for transportation to the job site.

3. The process described in claim 1, further comprising electrically connecting the plurality of solar panels to one another in series.

4. The process described in claim 1, further comprising attaching a direct current to alternating current inverter to the solar panel support channel and electrically connecting the inverter to the plurality of solar panels.

5. The process described in claim 1, wherein the solar panel support channels are "Z"-channels.

6. The process described in claim 1, wherein the solar panel support channels are "C"-channels.

7. The process described in claim 1, wherein the solar panel support channels comprises integral alignment tabs for aligning the solar panels on the solar panel support channels.

8. The process described in claim 1, wherein the plurality of solar panels is from about 4 to about 20 solar panels.

9. The process described in claim 1, further comprising manufacturing the solar panel support channel at a solar canopy construction site using rolled sheet metal form extrusion.

10. The process described in claim 1, further comprising attaching an eye bolt to the solar panel string assembly for lifting the solar panel string assembly during construction.

11. The process described in claim 1, wherein the lift component comprises a vacuum lift tool.

12. The process described in claim 1, wherein the step of horizontally aligning two solar panel support channels substantially parallel to one another occurs on a surface sufficiently angled so as to provide worker access beneath finally assembled solar panel string assembly for electrical connections.

13. The process described in claim 1, wherein after forming a solar panel string assembly the assembly is sufficiently tilted so as to provide worker access beneath for electrical connections.

* * * * *